United States Patent
Lee et al.

(10) Patent No.: US 6,826,114 B2
(45) Date of Patent: Nov. 30, 2004

(54) DATA PATH RESET CIRCUIT USING CLOCK ENABLE SIGNAL, RESET METHOD, AND SEMICONDUCTOR MEMORY DEVICE INCLUDING THE DATA PATH RESET CIRCUIT AND ADOPTING THE RESET METHOD

(75) Inventors: Jung-bae Lee, Yongin (KR); Won-chang Jung, Yongin (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/624,783

(22) Filed: Jul. 22, 2003

(65) Prior Publication Data

US 2004/0090830 A1 May 13, 2004

(30) Foreign Application Priority Data

Sep. 11, 2002 (KR) .................. 10-2002-0055008

(51) Int. Cl.$^7$ ................................ G11C 8/00
(52) U.S. Cl. ................... 365/233; 365/230.03
(58) Field of Search ............ 365/233, 230.03, 365/230.08, 233.5

(56) References Cited

U.S. PATENT DOCUMENTS

| | | | |
|---|---|---|---|
| 5,065,052 A | * 11/1991 | Sakagami et al. ............ 327/19 |
| 5,430,399 A | * 7/1995 | Wendell ...................... 326/121 |
| 5,610,541 A | * 3/1997 | Yoon .......................... 327/143 |
| 5,719,812 A | * 2/1998 | Seki et al. ................... 365/194 |
| 6,762,632 B1 | * 7/2004 | Himpe et al. ................ 327/142 |

* cited by examiner

Primary Examiner—Anh Phung
(74) Attorney, Agent, or Firm—Mills & Onello, LLP

(57) ABSTRACT

Provided are a reset circuit of a data path using a clock enable signal, a reset method and a semiconductor memory device having the reset circuit. The reset circuit includes an external voltage detector and a second reset signal generator, in which the second reset signal is used to reset a block related to a data path of the semiconductor memory device. The external voltage detector detects the level of an external voltage and generates a first reset signal. The second reset signal generator performs a logical sum of an external signal, which is externally input, and the first reset signal, and generates a second reset signal. The first reset signal is used to reset blocks other than the blocks related to the data path. The external signal is a clock enable signal. In the soft reset, the blocks related to the data path are reset using the external signal which is applied at a certain level. Thus, data conflicts or ineffective data can be prevented in executing operations according to the read/write commands which are applied after the soft reset.

16 Claims, 2 Drawing Sheets

DATA PATH RESET CIRCUIT USING CLOCK ENABLE SIGNAL, RESET METHOD, AND SEMICONDUCTOR MEMORY DEVICE INCLUDING THE DATA PATH RESET CIRCUIT AND ADOPTING THE RESET METHOD

BACKGROUND OF THE INVENTION

This application claims the priority of Korean Patent Application No. 2002-55008, filed 11, Sep. 2002, in the Korean Intellectual Property Office, the contents of which are incorporated herein in their entirety by reference.

1. Field of the Invention

The present invention relates to a semiconductor memory device, and more particularly, to the resetting of a data path in a synchronous semiconductor memory device.

2. Description of the Related Art

A reset in a synchronous semiconductor memory device can be regarded as either a hard reset or a soft reset. In a case where a computer system including the synchronous semiconductor memory device is reset by turning the computer off and on, the hard reset is applied to the semiconductor memory device, and then a subsequent process is performed. However, in a case where the computer system is reset by using a reset key or a specific key of the computer system, the soft reset is applied to the synchronous computer system, and then a subsequent process is performed.

In the case where the soft reset is applied to the synchronous semiconductor memory device which operates synchronously with a clock signal, a level of an external voltage VCC may not be completely lowered to 0V. That is, rather than the level of the external voltage VCC being lowered to 0V and then raised to its initial level, the external voltage VCC may be barely lowered at all. In the case in which the hard reset is applied to. the synchronous semiconductor memory device, the level of the external voltage VCC is lowered to 0V and then raised to its initial level.

Most dynamic random access memory (DRAM) generates a control signal used for detecting the level of the external voltage VCC and resetting all internal nodes of the DRAM. However, when the soft reset is applied by lowering the external voltage VCC by a small amount, it is difficult to detect such a small change in the level of the external voltage VCC and reset all internal nodes of the DRAM.

Current double data rate (hereinafter, referred to as DDR) synchronous dynamic random access memory (SDRAM) devices prevent the execution of the soft reset, i.e., the application of a clock enable signal (CKE) having a low level, while a data path is operating. However, if a control signal related to the data path is not reset to a low level when a soft reset is desired during an operation of a read command or a write command, a problem such as data conflict can be caused when a read command or a write command is applied.

In the case of a hard reset, the level of the external voltage VCC is lowered to 0V and then returns to its initial level, and internal circuits are reset. However, in some cases, a desired internal circuit is not reset in a soft reset where the level of the external voltage changes only slightly. Thus, an abnormal function occurs in which data are continuously output even though the soft reset is applied.

In current DDR SDRAM devices, the low level clock enable signal CKE is always applied during the soft/hard resets. Therefore, if the control signal related to an output driver and the data path are reset when the clock enable signal CKE is at the low level, data conflicts do not occur in executing operations according to next commands.

SUMMARY OF THE INVENTION

It is an object of the present invention to provide a circuit and a method which make it possible to reset blocks and control signals related to a data path in a soft reset, thereby performing an operation according to a next command without any errors, and a semiconductor memory device including the circuit and adopting the method.

According to an aspect of the present invention, there is provided a reset signal generating circuit in a semiconductor memory device. The circuit comprises an external voltage detector which detects a level of an external voltage and generates a first reset signal, and a second reset signal generator which performs a logical sum of an external signal and the first reset signal, and outputs the result of the logical sum as a second reset signal. The second reset signal is used to reset a block related to a data path of the semiconductor memory device.

Preferably, the first reset signal is used to reset blocks other than the block related to the data path.

The external signal can be a clock enable signal. The second reset generator can include an automatic pulse generator which generates a pulse signal which maintains a first logic level during a predetermined period in response to the clock enable signal, and a logical sum gate which logically sums the pulse signal and the first reset signal, and outputs the result as the second reset signal.

The block related to the data path can further include a data output driver for performing a driving operation for outputting the data, which is output via a pad from the memory cell and then detected. The block related to the data path can further include a data input driver which performs a driving operation on the data which is externally input through the pad. The block related to the data path can include at least a part of a data output circuit in a path from an output node of an input/output sense amplifier which senses and amplifies the data output from a memory cell to an input/output pad.

According to another aspect of the present invention, there is provided a semiconductor memory device comprising a memory cell array, a row decoder which selects and activates a word line of the memory cell array in response to a row address signal, a column decoder which selects a column line of the memory cell array in response to a column address signal, an input/output sense amplifier which senses and amplifies the data output from the memory cell array, a data line driver for inputting the data in the memory cell array, a data output unit which outputs through an input/output port the data output from the input/output sense amplifier, a data input unit which transmits the data input from input/output pad to the data line driver, a control logic unit which generates a plurality of control signals in response to an address signal and a command signal, and a reset signal generating circuit which generates a first reset signal and a second reset signal in response to an external voltage and an external signal, wherein the data output unit is at least partially reset in response to the second reset signal.

Preferably, the reset signal generating circuit comprises an external voltage detector which detects the level of the external voltage and generates the first reset signal, and a second reset signal generator which performs a logical sum of a clock enable signal, which is externally input, and the first reset signal, and outputs the result of the logical sum as the second reset signal.

In one embodiment, the second reset signal generator comprises an automatic pulse generator which generates a pulse signal which maintains a first logic level for a predetermined period in response to the clock enable signal, and a logical sum gate which performs a logical sum of the pulse signal and the first reset signal, and outputs the second reset signal.

In one embodiment, the second reset signal is also used to reset at least a part of the data input unit.

According to another aspect of the present invention, there is provided a method for resetting an internal circuit of a semiconductor memory device, the method comprising detecting the level of an external voltage and generating a first reset signal, logically summing an external signal and the first reset signal and generating a second reset signal, resetting a block related to a data path in response to the second reset signal, and resetting blocks other than the block related to the data path in response to the first reset signal.

In one embodiment, the external signal is a clock enable signal.

In one embodiment, step (b) further comprises generating a pulse signal which maintains a first logic level for a period of time in response to the clock enable signal and performing a logical sum of the pulse signal and the first reset signal, and outputting the second reset signal.

In one embodiment, the block related to the data path further includes a data output driver for performing a driving operation for outputting the data through a pad, the data being output from a memory cell and then detected.

In one embodiment, the block related to the data path includes at least a part of the data output circuit in the path from an output node of an input/output sense amplifier which senses and amplifies data output from the memory cell to an input/output pad.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The semiconductor memory device as described herein will be in one of the following states when the soft reset is applied thereto: 1. A precharge state, 2. A bank active state, 3. A read/write state, 4. An automatic refresh state, 5. A self refresh state or 6. A power down state.

A low level clock enable signal CKE is applied to the semiconductor memory device when the soft reset is applied to the semiconductor memory device. The low level clock enable signal CKE is also applied to the semiconductor memory device when other normal operations other than the soft reset are performed. When the clock enable signal CKE is applied at the low level, it is difficult to determine whether the soft reset is applied or a normal operation is performed. Therefore, it is preferable that only the blocks and control signals related to a data path are reset by the low level clock enable signal CKE so as not to affect the normal operations. This is because in a normal operation of the DDR SDRAM, the low level clock enable signal CKE can be applied only when the data path does not operate.

In states 1, 2 and 4, the control signal related to the data path has already been reset, and thus the block related to the data path and the control signal can be reset by the low level clock enable signal CKE without affecting the normal operation. In cases 5 and 6, the low level clock enable signal CKE has been already applied, and thus the block related to the data path and the control signal can be reset without affecting the normal operation, likewise.

Therefore, in the present invention, reset signals for resetting a data path block and resetting a control signal are generated by using the clock enable signal CKE which is externally input.

Figure 1:
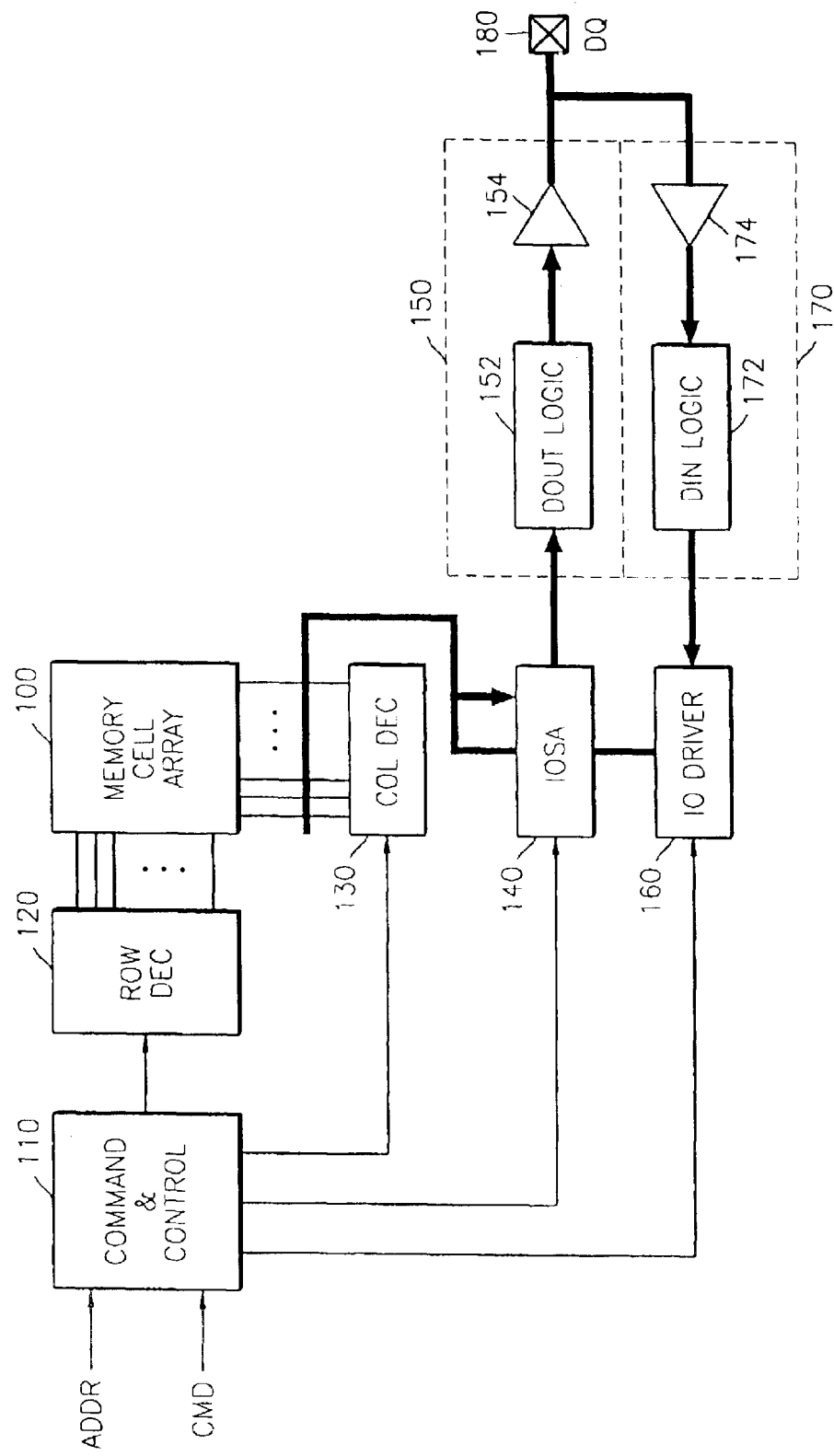
FIG. 1 is a block diagram of a conventional semiconductor memory device.

FIG. 1 is a block diagram of a conventional semiconductor memory device. A memory cell array 100 of the semiconductor memory device includes a plurality of memory cells which are arranged in crossings of row lines, i.e., word lines and column lines, i.e., bit lines. A bit of data can be stored in each memory cell. A row decoder 120 selects and activates one of the word lines of the memory cell array 100 in response to a row address signal in address signal ADDR input from outside. A column decoder 130 selects one of the column lines of the memory cell array 100 which will be used for a data input/output in response to a column address signal.

An input/output sense amplifier (IOSA) 140 senses and amplifies data which is output from the memory cell array 100 to a data line through a bit line. The data, which is sensed and amplified by the input/output sense amplifier 140, is output to outside the memory device via a data output unit 150 through a data input/output pad 180. The data output unit 150 includes a data output driver 154 which performs a driving operation for outputting internal data to outside the memory device, and a data output logic unit 152 which transmits the data received from the input/output sense amplifier 140 to the data output driver 154 and controls the data output driver 154.

The data externally input through the data input/output pad 180 are written in the memory cell array 100 via a data input unit 170 through a data line driver 160. The data input unit 170 includes a data input driver 174 and a data input logic unit 172. The data input driver 174 performs a buffering or a driving operation for transmitting data, which is received from the data input/output pad 180, to the inside. The data input logic unit 172 transmits the data, which is output from the data input driver 174, to the data line driver 160 and controls the data input driver 174. A control logic unit 110 includes the row decoder 120, the column decoder 130, the input/output sense amplifier 140 and the data line driver 160 so as to generate a plurality of control signals for controlling an internal circuit in response to an address signal ADDR and a command signal CMD which are input from outside the memory device.

The semiconductor memory device according to the present invention includes a reset signal generating circuit in addition to the constituent blocks of the conventional semiconductor memory device of FIG. 1.

Figure 2:
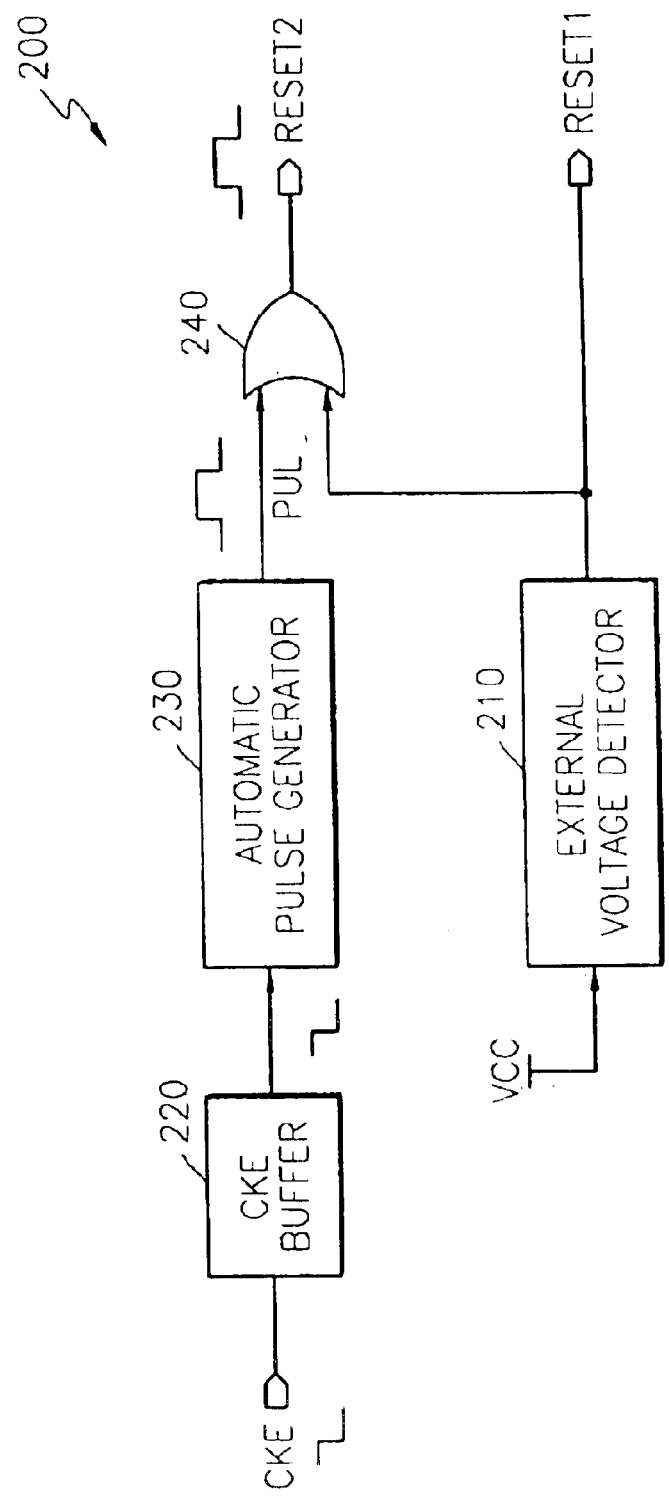
FIG. 2 is a block diagram of a reset signal generating circuit according to an embodiment of the present invention.

FIG. 2 is a block diagram of a reset signal generating circuit 200 according to one embodiment of the present invention. Referring to FIG. 2, the reset signal generating circuit 200 according to one embodiment of the present invention uses two kinds of information on the resetting of the internal circuit of the DRAM. That is, the reset signal generating circuit 200 generates at least one reset signal for resetting a block and a control signal of the DRAM by using the external voltage VCC and the clock enable signal CKE.

The reset signal generating circuit 200 includes an external voltage detector 210, a clock enable signal buffer 220, an automatic pulse signal generator 230 and an OR gate 240.

The external voltage detector 210 detects the level of the external voltage VCC and generates a first reset signal RESET1 of a high level until the external voltage VCC fully reaches the high level. The first reset signal RESET1 is used to initialize blocks except for the data path and control signals. After the external voltage VCC reaches the high level, the external voltage detector 210 lowers the level of the first reset signal RESET1 to a low level so as to stop the reset. Since the external voltage VCC is lowered to the low level sufficiently in the case where hard reset is applied, the external voltage detector 210 detects the application of the hard reset and resets an internal block and a node.

The clock enable signal buffer 220 buffers the clock enable signal CKE which is input from the outside, and converts the clock enable signal CKE into an internal signal. The automatic pulse signal generator 230 is synchronized with a falling edge of the clock enable signal CKE and generates a pulse signal PUL which maintains a high level for a certain period of time. The OR gate 240 performs an OR operation on the pulse signal PUL output from the automatic pulse generator 230 and the first reset signal RESET1 output from the external voltage detector 210, and outputs the result of the OR operation as the second reset signal RESET2.

Therefore, the second reset signal RESET2 maintains the high level for a certain period of time if the external voltage VCC or the clock enable signal CKE is lowered to the low level. The second reset signal RESET2 is used to reset the block related to the data path.

The block related to the data path can include a part of or all of the data output unit 150 of FIG. 1 and, in one embodiment, it includes the data output driver 154 of FIG. 1. In addition, the block can include a part of or all of the data input unit 170 of FIG. 1. The reset of the block related to the data path means that internal nodes of the block related to the data path and/or the control signal for controlling the block related the data path are initialized.

In the hard reset, the first and the second reset signals RESET1 and RESET2 are generated. Therefore, the block related to the data path and other internal blocks are initialized. However, in the soft reset, only the second reset signal RESET2 is generated, and thus only the blocks related to the data path are initialized.

Since the clock enable signal CKE can be at the low level in a normal power down operation rather than the soft reset, the internal nodes of all blocks cannot be initialized by using the second reset signal RESET2. That is, the internal node which determines a mode of the semiconductor device, such as a mode register set, may be reset by the low level clock enable signal CKE, and then normal operation of the circuit may be impossible. Therefore, the reset by the clock enable signal CKE is limited in its use with a specific block of the semiconductor memory device.

As described above, two reset signals are generated for resetting an internal circuit of the semiconductor memory device. One is a first reset signal which is used to reset the specific block related to the data path, and the other is a second reset signal which is used to reset the internal block other than the specific block related to the data path. In the hard reset, both of the two reset signals are generated, and thus all internal circuits are initialized. In the soft reset, only the first reset signal is generated, and thus the specific block related to the data path is initialized. By using the above described resets, an error in executing operations according to write/read commands after the soft reset can be prevented without affecting normal operation.

As described above, in the soft reset, the blocks related to the data path are reset by using the external signal which is applied at a certain level. Thus, data conflicts or ineffective data can be prevented in executing operations according to the read/write commands which are applied after the soft reset.

While this invention has been particularly shown and described with reference to preferred embodiments thereof, it will be understood by those skilled in the art that various changes in form and details may be made therein without departing from the spirit and scope of the invention as defined by the appended claims and equivalents.

What is claimed is:

1. A reset signal generating circuit for initiating an internal circuit of a semiconductor memory device, the circuit comprising:

an external voltage detector which detects a level of an external voltage and generates a first reset signal; and a second reset signal generator which performs a logical sum of an external signal and the first reset signal, and outputs the result of the logical sum as a second reset signal, wherein the second reset signal is used to reset a block related to a data path of the semiconductor memory device.

2. The circuit of claim 1, wherein the first reset signal is used to reset blocks other than the block related to the data path.

3. The circuit of claim 1, wherein the external signal is a clock enable signal.

4. The circuit of claim 3, wherein the second reset generator comprises:

an automatic pulse generator which generates a pulse signal which maintains a first logic level during a predetermined period in response to the clock enable signal; and a logical sum gate which logically sums the pulse signal and the first reset signal, and outputs the result as the second reset signal.

5. The circuit of claim 3, wherein the block related to the data path further includes a data output driver for performing a driving operation for outputting the data through a pad, the data being output from a memory cell and then detected.

6. The circuit of claim 5, wherein the block related to the data path further includes a data input driver which performs a driving operation on the data which is externally input through the pad.

7. The circuit of claim 3, wherein the block related to the data path includes at least a part of a data output circuit in a path from an output node of an input/output sense amplifier which senses and amplifies the data output from a memory cell to an input/output pad.

8. A semiconductor memory device comprising;

a memory cell array;

a row decoder which selects and activates a word line of the memory cell array in response to a row address signal;

a column decoder which selects a column line of the memory cell array in response to a column address signal;

an input/output sense amplifier which senses and amplifies the data output from the memory cell array;

a data line driver for inputting the data in the memory cell array;

a data output unit which outputs through an input/output pad the data output from the input/output sense amplifier;

a data input unit which transmits the data input from input/output pad to the data line driver;

a control logic unit which generates a plurality of control signals in response to an address signal and a command signal; and a reset signal generating circuit which generates a first reset signal and a second reset signal in response to an external voltage and an external signal, wherein the data output unit is at least partially reset in response to the second reset signal.

9. The semiconductor memory device of claim 8, wherein the reset signal generating circuit comprises:

an external voltage detector which detects the level of the external voltage and generates the first reset signal; and a second reset signal generator which performs a logical sum of a clock enable signal, which is externally input, and the first reset signal, and outputs the result of the logical sum as the second reset signal.

10. The semiconductor memory device of claim 9, wherein the second reset signal generator comprises:

an automatic pulse generator which generates a pulse signal which maintains a first logic level for a predetermined period in response to the clock enable signal; and a logical sum gate which performs a logical sum of the pulse signal and the first reset signal, and outputs the second reset signal.

11. The semiconductor memory device of claim 9, wherein the second reset signal is also used to reset at least a part of the data input unit.

12. A method for resetting an internal circuit of a semiconductor memory device, the method comprising:

(a) detecting the level of an external voltage and generating a first reset signal;

(b) logically summing an external signal and the first reset signal and generating a second reset signal;

(c) resetting a block related to a data path in response to the second reset signal; and (d) resetting blocks other than the block related to the data path in response to the first reset signal.

13. The method of claim 12, wherein the external signal is a clock enable signal.

14. The method of claim 13, wherein step (b) further comprises:

generating a pulse signal which maintains a first logic level for a period of time in response to the clock enable signal; and performing a logical sum of the pulse signal and the first reset signal, and outputting the second reset signal.

15. The method of claim 13, wherein the block related to the data path further includes a data output driver for performing a driving operation for outputting the data through a pad, the data being output from a memory cell and then detected.

16. The method of claim 13, wherein the block related to the data path includes at least a part of the data output circuit in the path from an output node of an input/output sense amplifier which senses and amplifies data output from the memory cell to an input/output pad.

* * * * *